United States Patent
Zhang

(10) Patent No.: US 10,432,199 B1
(45) Date of Patent: Oct. 1, 2019

(54) LOW POWER, WIDE RANGE, HIGH NOISE TOLERANCE LEVEL SHIFTER

(71) Applicant: NXP USA, Inc., Austin, TX (US)

(72) Inventor: Xu Zhang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/195,414

(22) Filed: Nov. 19, 2018

(51) Int. Cl.
| | |
|---|---|
| *H03K 19/0185* | (2006.01) |
| *H03K 3/012* | (2006.01) |
| *H03K 19/00* | (2006.01) |
| *H03K 3/037* | (2006.01) |

(52) U.S. Cl.
CPC ..... *H03K 19/018521* (2013.01); *H03K 3/012* (2013.01); *H03K 3/037* (2013.01); *H03K 19/0013* (2013.01); *H03K 19/018507* (2013.01)

(58) Field of Classification Search
CPC ....... H03K 19/018521; H03K 19/0013; H03K 3/012; H03K 3/037; H03K 19/018507; H03K 19/0175; G06F 3/00
See application file for complete search history.

(56) References Cited

U.S. PATENT DOCUMENTS

| | | | | |
|---|---|---|---|---|
| 7,295,038 | B2 * | 11/2007 | Seo ..................... | H03K 19/0016 326/68 |
| 2008/0204078 | A1 * | 8/2008 | O ..................... | H03K 19/018528 326/81 |

OTHER PUBLICATIONS

Yong et al., "An Energy-Efficient and Wide-Range Voltage Level Shifter With Dual Current Mirror," IEEE Transactions on Very Large Scale Integration (VLSI) Systems, vol. 25, No. 12, Dec. 2017, 5 pages.
Luo et al., "A Wide-Range Level Shifter Using a Modified Wilson Current Mirror Hybrid Buffer," IEEE Transactions on Circuits and Systems—I: Regular Papers, vol. 61, No. 6, Jun. 2014, 10 pages.
Zhou et al., "An Ultra-Low Voltage Level Shifter Using Revised Wilson Current Mirror for Fast and Energy-Efficient Wide-Range Voltage Conversion from Sub-Threshold to I/O Voltage", IEEE Transactions on Circuits and Systems I: Regular Papers, vol. 62, No. 3, 2015, 10 pages.
Le et al., "An Area and Energy Efficient Ultra-Low Voltage Level Shifter With Pass Transistor and Reduced-Swing Output Buffer in 65-nm CMOS," IEEE Transactions on Circuits and Systems—II: Express Briefts, vol. 54, No, 5, May 2018, 5 pages.

* cited by examiner

*Primary Examiner* — Jung Kim
(74) *Attorney, Agent, or Firm* — Senaida B. San Miguel

(57) ABSTRACT

Embodiments for a level shifter are provided, including: a current mirror comprising a reference current transistor and a mirrored current transistor; a pull-down network comprising a first and a second pull-down transistor, wherein the first and second pull-down transistors are respectively connected in series with the reference and mirrored current transistors; a pull-up transistor connected to an intermediate node located between the mirrored current transistor and the second pull-down transistor; a transition control transistor connected to the gate electrode of the reference current transistor; a cut-off transistor connected between the first pull-down transistor and a common negative power supply voltage; and a first and a second inverter connected to the intermediate node, wherein a control node is located between the first and second inverters, and gate electrodes of the pull-up transistor, the transition control transistor, and the cut-off transistor are connected to the control node.

20 Claims, 4 Drawing Sheets

LOW POWER, WIDE RANGE, HIGH NOISE TOLERANCE LEVEL SHIFTER

BACKGROUND

Field

This disclosure relates generally to microelectronic circuitry, and more specifically, to level shifter circuitry in a multi-voltage domain integrated circuit.

Related Art

In low power applications such as Internet of Things (IoT), energy harvesting, and the like, multiple voltage level techniques are applied either to reduce the power consumption or to support multiple power sources. Level shifters serve as the interface for different supply domains. A level shifter in a signal processing or clock path is critical, since it is expected to operate in a wide voltage range with low power and high noise tolerance for up to a few MHz. Higher frequency is rare for low power systems since system power typically scales with the working frequency.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Complex semiconductor devices often implement two or more power supply voltage domains to achieve improved speed, power, and reliability. Logic signals are conveyed from one voltage domain to another using a level shifter at a boundary between the domains. The level shifter converts the voltage level of a logic high (e.g., "1") state signal from one voltage domain to a voltage suitable for the destination voltage domain. The voltage level of a logic low (e.g., "0") state signal is typically the same (e.g., ground). A complex semiconductor device, such as a system on chip (or SoC) may have many level shifters, so it is important that the power consumption of the level shifters themselves be reduced so that they do not penalize the power savings obtained by multiple voltage domains.

Figure 3:
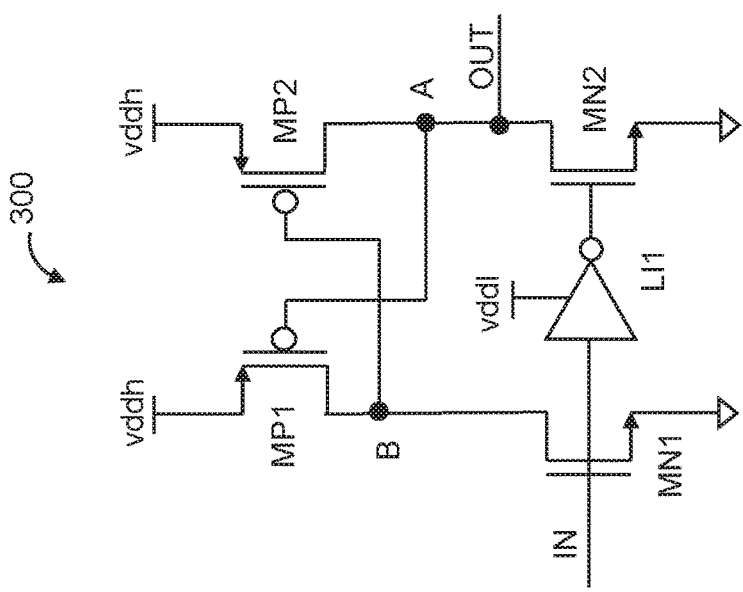
FIG. 3 is a circuit schematic depicting a conventional cross-coupled PMOS (p-type metal-oxide-semiconductor) based level shifter.

FIG. 3 shows a circuit schematic of a conventional cross-coupled PMOS (p-type metal-oxide-semiconductor) based level shifter 300 for shifting signals from a low voltage domain having a first positive power supply voltage, VDD_low, to a high voltage domain having a second positive power supply voltage, VDD_high, that is greater than VDD_low. Both domains have a common negative power supply voltage, ground. Level shifter 300 includes two NMOS (or n-type metal-oxide-semiconductor) transistors MN1 and MN2, two PMOS (or p-type metal-oxide-semiconductor) transistors MP1 and MP2, and one inverter in the low voltage domain, LI1. An input signal IN from the low voltage domain, which may be a logic high state (e.g., "1") achieved by VDD_low or a logic low state (e.g., "0") achieved by ground, is connected to the gate electrode of MN1 and to the input of inverter LI1, which outputs an inverted input signal connected to the gate of MN2. The source electrodes of MN1 and MN2 (where NMOS "source" is indicated by the outward pointing arrow in the drawings) are connected to ground. The drain electrodes of MN1 and MN2 are respectively connected to drain electrodes of MP1 and MP2, where the tied drain electrodes of MN2 and MP2 are labeled as node A. The gate electrode of MP1 is connected to the drain electrode of MP2, and the gate electrode of MP2 is connected to the drain electrode of MP1, which is labeled as node B. The source electrodes of MP1 and MP2 (where PMOS "source" is indicated by the inward pointing arrow in the drawings) are connected to VDD_high (labeled as vddh in the drawings). The inverter LI1 is connected to VDD_low (labeled as vddl in the drawings). The node at the tied drain electrodes of MN2 and MP2 provides output signal OUT, which may be a logic high state (e.g., "1") achieved by VDD_high or a logic low state (e.g., "0") achieved by ground.

The PMOS transistors implement a pull up network, and the NMOS transistors implement a pull down network. When input signal IN is in a logic high state (e.g., a voltage level of VDD_low in the low voltage domain), MN1 is activated (or turned on to conduct current) and pulls node B down to ground, which in turn activates (or turns on) MP2. At the same time, MN2 receives an inverted input signal (or logic low) and is deactivated (or turned off to stop conducting current), which allows MP2 to charge up node A to a logic high state (e.g., a voltage level of VDD_high in the high voltage domain) as the output signal OUT. The logic high signal at node A keeps MP1 turned off. When IN is logic low (e.g., ground in the low voltage domain), MN1 is turned off and MN2 is turned on. MN2 pulls node A to ground to a logic low state (e.g., a voltage level of ground in the high voltage domain) as the output signal OUT. Since node A is low, MP1 is turned on, which charges up node B and keeps MP2 turned off.

One problem with the conventional cross-coupled level shifter is power consumption, since the NMOS transistors consume more power during the transitions due to the transient short-through current when swinging through the voltage range (e.g., VDD_high to ground) during operation, which limits how wide the operational voltage range can be. Another problem with the conventional cross-coupled level shifter 300 is the strong current contention between the pull-up network and the pull-down network, especially when converting from the subthreshold region (e.g., below 0.7V) to higher voltages (e.g., above 1.8V or greater). Since the pull-down network is typically much weaker compared to the pull-up network, the NMOS transistors need to be upsized to overcome the strength of the pull-up network, especially when VDD_high is a much higher voltage level than VDD_low for a wide voltage range. However, such an upsize would result in a large area penalty and increased power consumption (and larger short-through current) and would simply be impractical for implementation. The size of the NMOS transistors also makes it difficult to extend the operational voltage range of the cross-coupled level shifter in the subthreshold region.

Figure 4:
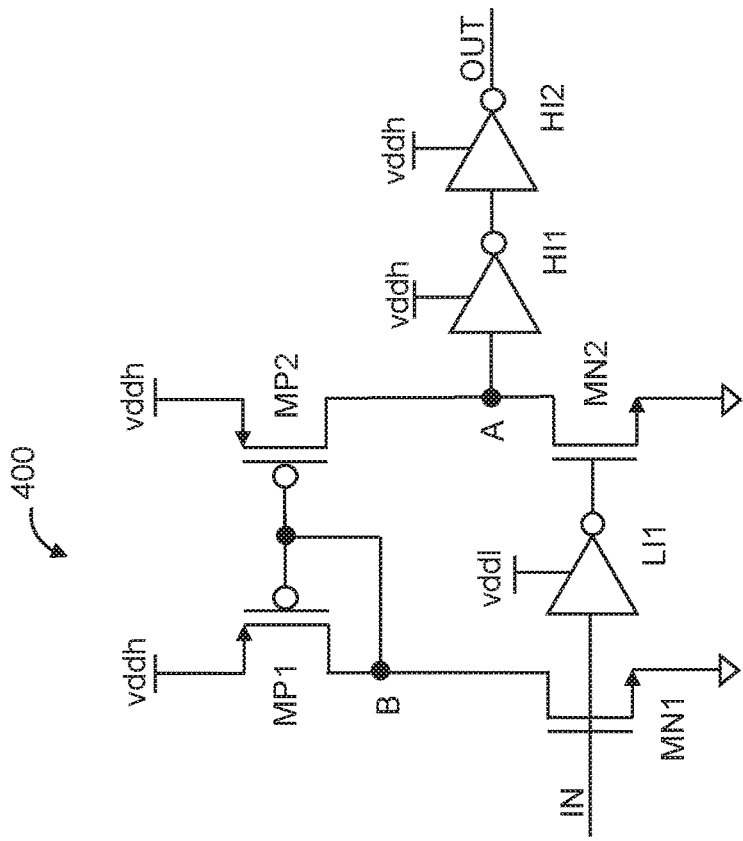
FIG. 4 is a circuit schematic depicting a conventional current mirror based level shifter.

FIG. 4 shows a circuit schematic of a conventional current mirror based level shifter 400, which includes two NMOS transistors MN1 and MN2, two PMOS transistors MP1 and MP2, and three inverters, one in the low voltage domain, LI1, and two in the high voltage domain, HI1 and HI2. Transistors MN1, MN2, MP1, and MP2 and inverter LI1 are connected in a similar way as described above in connection with FIG. 3. However, instead of the gate electrodes of MP1 and MP2 being cross-coupled in FIG. 3, the gate electrodes of MP1 and MP2 are tied and are connected to MP1's drain electrode in FIG. 4. Further, node A at the tied drain electrodes of MN2 and MP2 is connected to series-connected inverters HI1 and HI2, both of which are connected to VDD_high.

When IN is logic high, MN1 is turned on and MN2 is turned off. MN1 pulls node B down to ground, turning on both MP1 and MP2. MP2 begins charging up node A to logic high. To ensure that the output signal OUT is sufficiently at VDD_high, the voltage at node A is provided to series-connected inverters HI1 and HI2. When IN is logic low, MN1 is turned off and MN2 is turned on. MN2 pulls node A to ground, and the output at HI2 is logic low. While the conventional current mirror based level shifter 400 resolves the pull-up and pull-down contention issues present in the cross-coupled level shifter, another problem is seen in the large static current passing through MP1 and MN1 when the input signal IN is logic high, which results in large standby power consumption when the input signal IN consistently remains at the logic high level. Further, current mirror based level shifters suffer from asymmetrical transitions due to greater delay at the output rise transition from logic low to logic high based on the time needed to charge up node A, as compared to the output fall transition from logic high to logic low based on the time needed to pull down node A.

Figure 5:
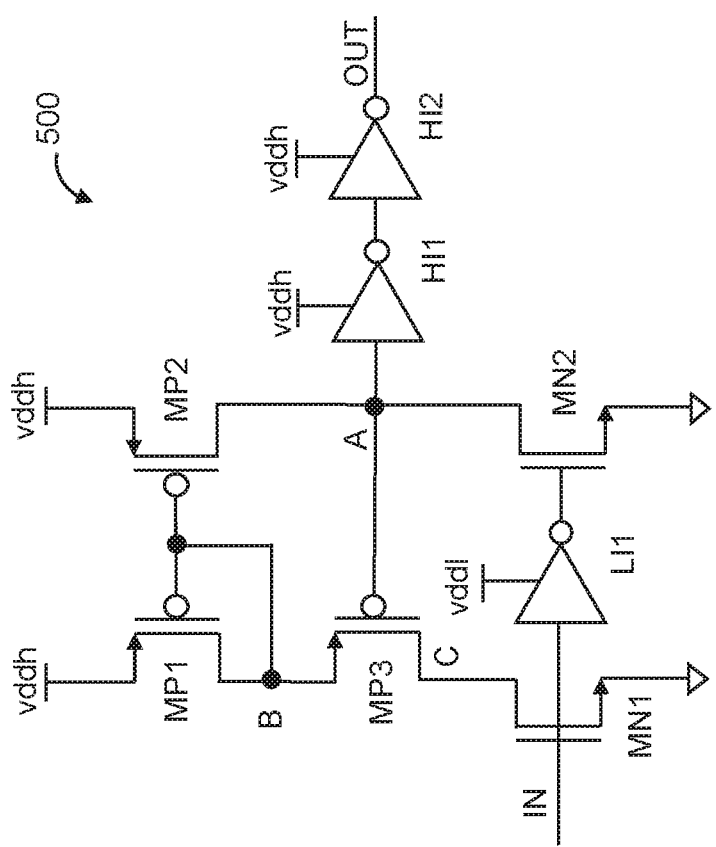
FIG. 5 is a circuit schematic depicting a conventional Wilson current mirror level shifter.

FIG. 5 shows a circuit schematic of a conventional Wilson current mirror level shifter circuit 500, which includes two NMOS transistors MN1 and MN2, three PMOS transistors MP1, MP2, and MP3, and three inverters, one in the low voltage domain, LI1, and two in the high voltage domain, HI1 and HI2. Transistors MN1, MN2, MP1, and MP2 and inverters LI1, HI1, and HI2 are connected in a similar way as described above in connection with FIG. 4. However, a third PMOS transistor MP3 is inserted between the drain electrodes of MP1 and MN1, where the gate electrode of MP3 is tied to node A (or the shared drain electrodes of MP2 and MN2). The tied drain electrodes of MP3 and MN1 are labeled as node C. MP3 provides feedback control to eliminate the static current through MP1 and MN1 by breaking the path after the voltage at node A goes logic high (when IN is logic high). However, when the current through MP1 is cut off, the mirrored current through MP2 is reduced, causing a voltage drop at node A. This voltage drop results in a large static current on inverter HI1.

The present disclosure provides an improved level shifter design that minimizes power consumption, achieves high noise tolerance, and has a wide range of voltage operation. The present level shifter design is a current source based design. The present level shifter achieves low power consumption and wide range of voltage operation by timely turning off the strong current path after a signal transition at an intermediate node triggers the output signal transition. The transient short-through current is reduced for a wide voltage range. Additionally, the present level shifter achieves high noise tolerance by using strong pull-up or pull-down devices to drive all the internal signal nodes in the signal path, which avoids any internal high impedance nodes. By strongly pulling-up or pulling-down the internal signal nodes, the present design is robust for noise coupled either from adjacent circuits or internal signal transitions. These features also make the design suitable for low power and wide voltage range operation up to a few MHz, such as for low power applications like Internet of Things (IoT), energy harvesting, and the like.

Example Embodiments

Figure 1:
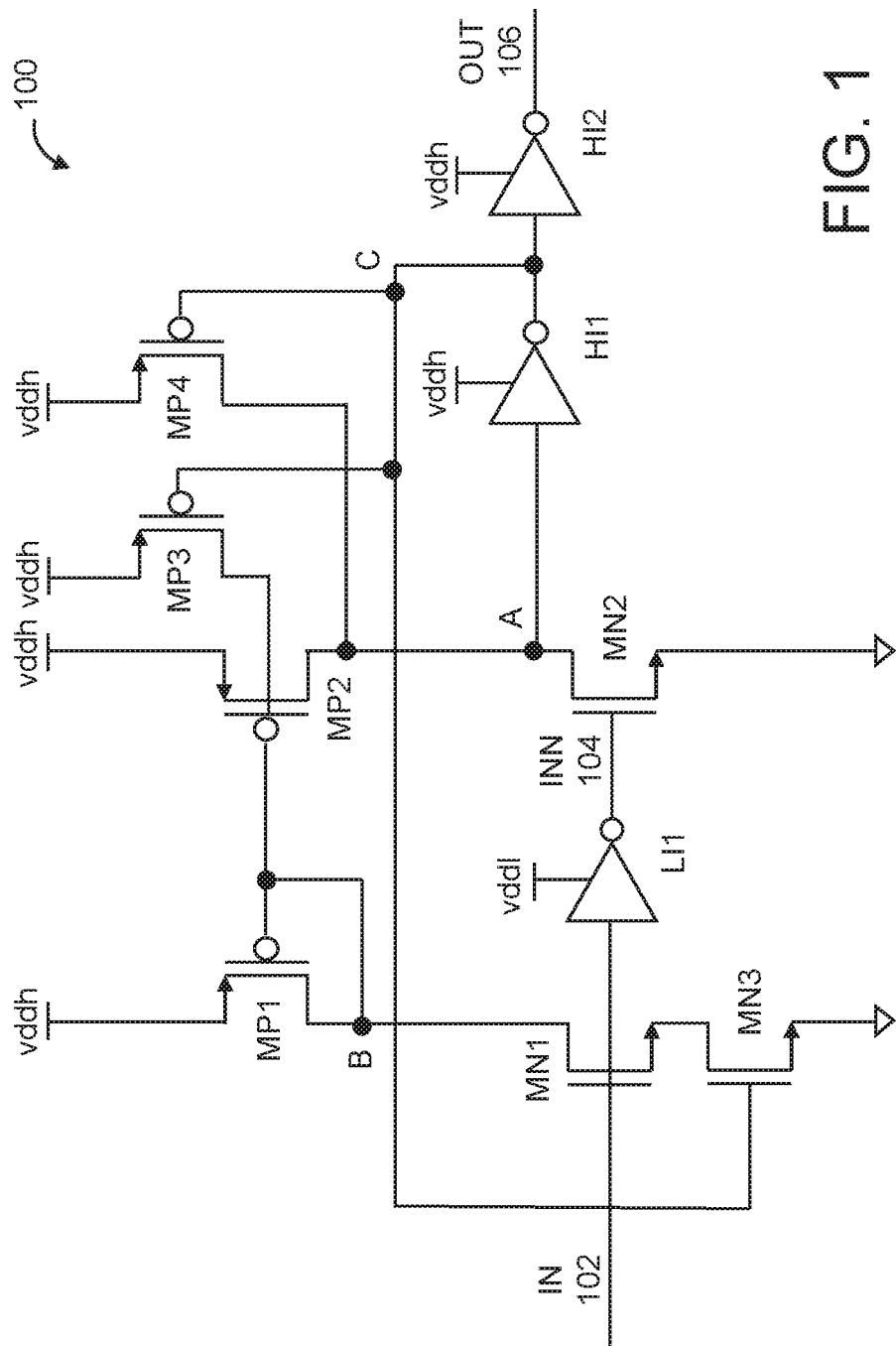
FIG. 1 is a circuit schematic depicting an example level shifter circuit, according to some embodiments of the present disclosure.

FIG. 1 shows a circuit schematic of an improved level shifter circuit 100. Level shifter 100 includes three NMOS (n-type or n-channel metal-oxide-semiconductor) transistors MN1, MN2, and MN3, four PMOS (p-type or p-channel metal-oxide-semiconductor) transistors MP1, MP2, MP3, and MP4, and three inverters, one in the low voltage domain, LI1, and two in the high voltage domain, HI1 and HI2. The inverters described herein may be implemented using complementary metal-oxide-semiconductor (CMOS) technology, and the transistors may be implemented using metal-oxide-semiconductor field effect transistor (MOSFET) technology. It will be appreciated that although MOSFET technology is commonly referred to as metal-oxide-semiconductor technology, the gates of such transistors are often made from a non-metallic conductive material, such as polysilicon, and their channels may be insulated by an insulator other than simple oxide.

An input signal at node IN 102 received by level shifter 100 may be at a logic high state or a logic low state in a first voltage domain that uses a first positive power supply voltage, such as a low voltage domain that uses VDD_low. An output signal at node OUT 106 provided by level shifter 100 may be a logic high state or a logic low state in a second voltage domain that uses a second positive power supply voltage, such as a high voltage domain that uses VDD_high. The second positive power supply voltage is greater than the first positive power supply voltage, and the first and second voltage domains have a common negative power supply voltage such as ground. An intermediate signal at node INN 104 is also shown, which is the inverted version of the input signal in the first voltage domain.

The gate electrode of MN1 is connected to node IN 102 of level shifter 100. The gate electrode of MN1 is also connected to an input of inverter LI1, which is connected to (or powered by) the first positive supply voltage VDD_low (noted as vddl in the drawings). An output of inverter LI1 is connected to the gate electrode of MN2 at node INN 104. The output of inverter LI1 may be a logic high state (e.g., "1" at vddl) or a logic low state (e.g., "0" at ground) in the first voltage domain. The source electrode of MN1 (where NMOS "source" is indicated by the outward pointing arrow in the drawings) is connected to the drain electrode of MN3. The source electrodes of MN2 and MN3 are grounded (or connected to the common negative power supply voltage). MN1 and MN2 may be referred to as pull-down transistors in a pull-down network.

The drain electrode of MN1 is connected to the drain electrode of MP1. The drain electrode of MN2 is connected to the drain electrode of MP2, labeled as node A. The gate electrode of MP1 is connected to the gate electrode of MP2 (e.g., the gate electrodes are tied), which is also tied to the drain electrode of MP1, labeled as node B. The source electrodes of MP1 and MP2 are connected to the second positive supply voltage VDD_high (noted as vddh in the drawings). MP1 and MP2 implement a current mirror, where a reference current is passed through MP1 when activated, and a mirrored current is passed through MP2 when activated. MP1 may also be referred to as a reference current transistor, and MP2 may be referred to as a mirrored current transistor. It is noted that an NMOS transistor like MN1, MN2, and MN3, is activated or turned on when a logic high state signal is applied to the gate electrode and the conduction channel begins conducting current between its pair of current electrodes (e.g., from drain to source). A PMOS transistor like MP1, MP2, MP3, and MP4 are activated or turned on when a logic low state signal is applied to the gate electrode and the conduction channel begins conducting current between its pair of current electrodes (e.g., from source to drain).

A first current conduction path is formed through the conduction channels of MP1, MN1, and MN3 that are connected in series, when those transistors are activated. A second current conduction path is formed through the series-connected conduction channels of MP2 and MN2, when activated. Node A may be referred to as an intermediate node located between MP2 and MN2.

Node A is connected to an input of inverter HI1, and the output of inverter HI1 is labeled as node C. The output of inverter HI1 is connected to an input of inverter HI2. Both HI1 and HI2 are connected to (or powered by) the second positive supply voltage VDD_high. The output of HI2 is connected to node OUT 106 of level shifter 100, and the output signal at node OUT 106 may be a logic high state (e.g., "1" at vddh) or a logic low state (e.g., "0" at ground) in the second voltage domain. Inverters HI1 and HI2 may be referred to as a pair of series-connected inverters, with node C referred to as a control node located between inverters HI1 and HI2.

The gate electrode of MN3 is connected to node C. MN3 may be referred to as a cut-off transistor. The gate electrodes of MP3 and MP4 are also connected to node C. The drain electrode of MP3 is connected to the gate electrode of MP2 (or node B). The drain electrode of MP4 is connected to the drain electrode of MP2 (or node A). The source electrodes of MP3 and MP4 are connected to the second positive supply voltage VDD high. MP3 may also be referred to as a transition control transistor that controls when MP1 and MP2 are turned off. A third current conduction path is formed through the conduction channel of MP4 to node A, where MP2 and MP4 act as pull-up transistors that form alternating charging paths for node A, as further discussed below.

When the input signal at node IN 102 transitions from a logic low to a logic high state, MN1 is turned on and pulls node B down (where MN3 is turned on at this time due to a logic high on node C), which turns on MP1 and MP2 of the current mirror. The logic high state at node IN 102 is also provided to inverter LI1, which outputs a logic low state on node INN 104, turning off MN2. As a result, node A is pulled up to a logic high state by the current passed through MP2. Node A provides a logic high state signal to the input of inverter HI1, which outputs a logic low state signal that pulls node C down, which turns on MP3 and MP4. MP3 passes current to the tied gate electrodes of MP1 and MP2 and pulls up node B, which turns off MP1 and MP2. As node C transitions from logic high to logic low, the pull-up current for node A is switched from MP2 to MP4 as the reference current path via MP1 is turned off (which in turn reduces the mirrored current through MP2) and the current path via MP4 is turned on. The logic low signal at node C is also provided to MN3, turning it off. As a result, MN3 cuts off the current path from VDD_high to ground via MP1, MN1, and MN3 at a time after node A reaches a logic high state, reducing the short-through current and eliminating the static current through the first current conduction path. The logic low signal at node C is also provided to inverter HI2, which transitions the output signal at node OUT 106 from logic low to logic high.

When input signal at node IN 102 transitions from a logic high to a logic low state, MN1 is turned off (where MN3 is also turned off at this time due to a logic low on node C). The logic low input signal is also provided to inverter LI1, which outputs an inverted input signal at node INN 104 at logic high, turning on MN2. As a result, node A is pulled down to logic low, even though MP4 serves as a pull-up transistor at this moment because MN2 is sized much stronger than MP4. Node A provides the logic low signal to inverter HI1, which outputs a logic high signal, pulling node C up to logic high. The logic high signal at node C turns off MP3 and MP4. The logic high signal at node C is also provided to MN3, turning it on. The logic high signal at node C is also provided to inverter HI2, which transitions the output signal at node OUT 106 from logic high to logic low.

MN2 is sized to have a much stronger current pull-down capability than MP4 to provide for correct static behavior in the level shifter. Generally, a transistor's pull-down or pull-up capability is dependent on the dimensions of the transistor's gate, which is expressed as a width over length ratio (or W/L). For high speed operation, MN2 may have a width over length (or W/L) of an order higher than that of MP4. MP1-MP4 are not required to be equally sized. MP3 and MP4 may have similar W/L ratios, which may be smaller than the W/L ratios of MP1 and MP2. Since MP1 and MP2 form a current mirror, they may have the same size but are not required to have the same size. For example, MP2 may have a W/L ratio that is an integer multiple larger than MP1's W/L ratio in order to scale the current of MP2. MN1 and MN2 are also not required to have the same size. However, MN2 may be sized stronger (e.g., has a greater W/L) than MN1 since MN2 needs to pull down more current to overcome the pull-up behavior of MP4.

In this manner, the level shifter circuitry discussed above supports a wide voltage range of operation, such as having a VDD_low in the range of 0.8V to 1.2V and a VDD_high in the range of 1.5V to 6.0V. The size of MP4 is independent of the size of MP1, which typically is the compromise of a wide voltage range and power consumption trade-off, which also occurs for traditional cross-coupled and current source level shifters. All the internal signal nodes A, B, and C are strongly driven by pull-up or pull-down devices, even when MN2 or MN3 is off. This results in a high noise tolerance for the design.

Figure 2:
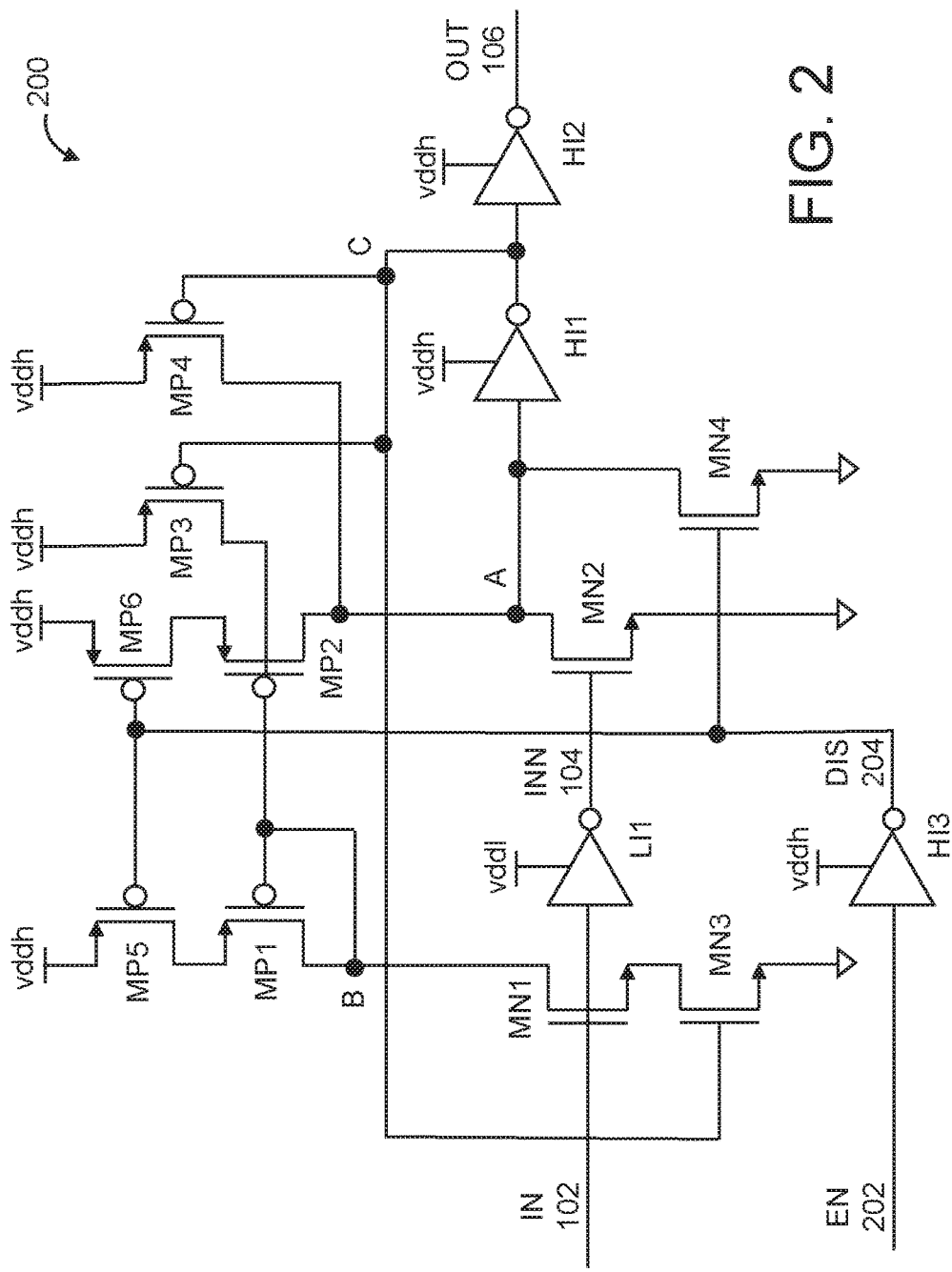
FIG. 2 is a circuit schematic depicting another example level shifter circuit, according to some embodiments of the present disclosure.

FIG. 2 shows a circuit schematic of an improved level shifter circuit 200 with disable capability. Level shifter 200 includes four NMOS transistors MN1, MN2, MN3, and MN4, six PMOS transistors MP1, MP2, MP3, MP4, MP5, and MP6, and four inverters, one in the low voltage domain, LI1, and three in the high voltage domain, HI1, HI2, HI3.

Transistors MN1, MN2, MN3, MP1, MP2, MP3, and MP4 are connected in a similar way as described above in connection with FIG. 1. However, instead of the source electrodes of MP1 and MP2 being connected to VDD_high, the source electrodes of MP1 and MP2 are coupled to VDD_high through MP5 and MP6, respectively. The source electrode of MP1 is connected to the drain electrode of MP5, and the source electrode of MP2 is connected to the drain electrode MP6. The source electrodes of MP5 and MP6 are connected to VDD_high. The gate electrode of MP5 is connected to the gate electrode of MP6. MP5 and MP6 may be referred to as access transistors.

An enable signal node EN 202 is connected to an input of inverter HI3, which is connected to (or powered by) VDD_high. The output of inverter HI3 is connected to the tied gate electrodes of MP5 and MP6, which is labeled as disable signal DIS 204. The gate electrode of MN4 is also connected to the disable signal DIS 204 at the output of inverter HI3. The drain electrode of MN4 is connected to node A, at the input of inverter HI1. The source electrode of MN4 is grounded. MN4 may be referred to as a pull-down transistor, and MP5, MP6, MN4, and HI3 may be referred to as a disable circuit.

When the enable signal at node EN 202 goes logic low, indicating that a disable mode is selected, the output of inverter HI3 generates disable signal DIS 204 that is logic high. Disable signal DIS 204 at logic high deactivates MP5 and MP6, which cuts off the supply current paths through MP1 and MP2. Further, disable signal DIS 204 at logic high activates MN4, which pulls node A to ground, which in turn pulls node C at the output of inverter HI1 to VDD_high. The logic high signal at node C turns off MP3 and MP4, which cuts off the supply current paths through MP3 and MP4. Eventually, output signal OUT 106 remains at logic low when level shifter 200 is disabled.

In some embodiments, a default output state of logic high may be achieved by replacing MN4 with a PMOS pull up transistor with inverted gate control. In such an embodiment, intermediate signal INN 104 should be properly gated to be held at logic low when disabled.

By now it should be appreciated that there has been provided an improved level shifter design that minimizes power consumption, achieves high noise tolerance, and has a wide range of voltage operation. The present level shifter design is a current source based design, which timely turns off the strong current path after a signal transition at an intermediate node triggers the output signal transition in order to reduce transient short-through current and static current.

In one embodiment of the present disclosure, a level shifter for converting an input signal from a first voltage domain to an output signal for a second voltage domain is provided, the level shifter including: a current mirror including a reference current transistor and a mirrored current transistor, wherein gate electrodes of the reference and mirrored current transistors are tied and are connected to a drain electrode of the reference current transistor; a pull-down network including a first and a second pull-down transistor, wherein gate electrodes of the first and second pull-down transistors are respectively connected to an input signal node and an inverted input signal node, and conduction channels of the first and second pull-down transistors are respectively connected in series with conduction channels of the reference and mirrored current transistors; a pull-up transistor having a conduction channel connected to an intermediate node located between the mirrored current transistor and the second pull-down transistor; a transition control transistor having a conduction channel connected to the gate electrode of the reference current transistor; a first and a second inverter connected in series between the intermediate node and an output signal node, wherein a control node is located between the first and second inverters, and gate electrodes of the pull-up transistor and the transition control transistor are connected to the control node; and a cut-off transistor having a gate electrode connected to the control node and a conduction channel connected in series between the conduction channel of the first pull-down transistor and a common negative power supply voltage for the first and second voltage domains.

One aspect of the above embodiment provides that the input signal includes a logic high state at a first positive power supply voltage in the first voltage domain, the output signal includes a logic high state at a second positive power supply voltage in the second voltage domain, and the second positive power supply voltage is greater than the first positive power supply voltage.

A further aspect of the above embodiment provides that the pull-down network further includes a third inverter connected in series between the gate electrodes of the first and second pull-down transistors, wherein the third inverter is connected to the first positive power supply voltage and is configured to output either the negative power supply voltage or the first positive power supply voltage.

Another further aspect of the above embodiment provides that a current conduction path is formed between the second positive power supply voltage and the negative power supply voltage through series-connected conduction channels of the reference current transistor, the first pull-down transistor, and the cut-off transistor.

A still further aspect of the above embodiment provides that the cut-off transistor is configured to break the current conduction path after the intermediate node has transitioned to a logic high state, and the transition control transistor is configured to turn off the current mirror after the intermediate node has transitioned to the logic high state.

Another further aspect of the above embodiment provides that a first charging path is formed through the conduction channel of the mirrored current transistor connected in series between the second positive power supply voltage and the intermediate node, a second charging path is formed through the conduction channel of the pull-up transistor connected in series between the second positive power supply voltage and the intermediate node, and the transition control transistor is connected in series between the second positive power supply voltage and the gate electrode of the reference current transistor.

A still further aspect of the above embodiment provides that after the intermediate node has transitioned to a logic high state: the control node, the transition control transistor, and the pull-up transistor form a charging control circuit configured to switch the intermediate node from the first charging path to the second charging path to maintain the logic high state at the intermediate node.

Another aspect of the above embodiment provides that when a logic high state is present at the input signal node: the first pull-down transistor is configured to turn on the current mirror, the mirrored current transistor is configured to charge up the intermediate node, the first inverter is configured to pull down the control node to a logic low state, which is configured to turn on the transition control transistor and the pull-up transistor, the transition control transistor is configured to turn off the current mirror as the pull-up transistor is turning on, the logic low state at the control node is further configured to turn off the cut-off transistor, and the cut-off transistor is configured to break a current conduction path formed through the reference current transistor, the first pull-down transistor, and the cut-off transistor.

Another aspect of the above embodiment provides that when a logic low state is present at the input signal node: the second pull-down transistor is configured to discharge the intermediate node, the first inverter is configured to charge up the control node, which is configured to turn off the transition control transistor and the pull-up transistor, and the control node further turns on the cut-off transistor.

Another aspect of the above embodiment provides that the second pull-down transistor is sized to have a pull-down capability stronger than a pull-up capability of the pull-up transistor.

Another aspect of the above embodiment provides that the first and second pull-down transistors and the cut-off transistors are n-channel transistors, and the reference and mirrored current transistors, the transition control transistor, and the pull-up transistor are p-channel transistors.

Another further aspect of the above embodiment provides that the level shifter further includes: a disable circuit including: a first access transistor having a conduction channel coupled between the reference current transistor and the second positive power supply voltage, a second access transistor having a conduction channel coupled between the mirrored current transistor and the second positive power supply voltage, wherein the first and second access transistors have tied gate electrodes, a disable inverter having an input connected to an enable signal node and an output connected to a disable signal node, the disable signal node connected to the tied gate electrodes of the first and second access transistors, a third pull-down transistor having a gate electrode connected to the disable signal node and a conduction channel coupled between the intermediate node and the negative power supply voltage.

A still further aspect of the above embodiment provides that when a logic low state is present at the enable signal node: the disable inverter is configured to output a logic high state at the disable signal node, which is configured to turn off the first and second access transistors, and the logic high state at the disable signal node is further configured to turn on the third pull-down transistor, which is configured to discharge the intermediate node.

In another embodiment of the present disclosure, a level shifter for converting an input signal from a first voltage domain to an output signal for a second voltage domain is provided, the level shifter including: a first and a second n-type transistor, each having a gate electrode respectively connected to an input signal node and an inverted input signal node; a first and a second p-type transistor, wherein drain electrodes of the first n-type transistor and the first p-type transistor are tied, drain electrodes of the second n-type transistor and the second p-type transistor are tied at an intermediate node, and gate electrodes of the first and second p-type transistors are tied and connected to the drain electrode of the first p-type transistor; a first and a second inverter connected in series between the intermediate node and an output signal node, wherein a control node is located between the first and second inverters; a third p-type transistor having a gate electrode connected to the control node and a drain electrode connected to the tied gate electrodes of the first and second p-type transistors; a fourth p-type transistor having a gate electrode connected to the control node and a drain electrode connected to the intermediate node; and a third n-type transistor having a gate electrode connected to the control node, a drain electrode connected to a source electrode of the first n-type transistor, and a source electrode connected to a common negative power supply voltage for the first and second voltage domains.

One aspect of the above embodiment provides that the input signal includes a logic high state at a first positive power supply voltage in the first voltage domain, the output signal includes a logic high state at a second positive power supply voltage in the second voltage domain, and the second positive power supply voltage is greater than the first positive power supply voltage.

A further aspect of the above embodiment provides that source electrodes of the first, second, third, and fourth p-type transistors are connected to the second positive power supply voltage.

Another further aspect of the above embodiment provides that the first and second inverters are powered by the second positive power supply voltage.

Another further aspect of the above embodiment provides that the level shifter further includes: a third inverter connected in series between the gate electrodes of the first and second n-type transistors, the third inverter is powered by the first positive power supply voltage.

Another aspect of the above embodiment provides that the third n-type transistor is configured to break a current conduction path formed through series-connected conduction channels of the first p-type transistor, the first n-type transistor, and the third n-type transistor after the intermediate node has transitioned to a logic high state in response to a logic high state at the input signal node, and the third p-type transistor is configured to turn off the first and second p-type transistors after the intermediate node has transitioned to the logic high state.

A further aspect of the above embodiment provides that after the intermediate node has transitioned to the logic high state: the control node, the third p-type transistor, and the fourth p-type transistor form a charging control circuit configured to switch from a pull-up current provided by the second p-type transistor to another pull-up current provided by the fourth p-type transistor to maintain the logic high state at the intermediate node.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Although the invention is described herein with reference to specific embodiments, various modifications and changes can be made without departing from the scope of the present invention as set forth in the claims below. For example, additional or fewer gating elements may be implemented in FIG. 2. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A level shifter for converting an input signal from a first voltage domain to an output signal for a second voltage domain, the level shifter comprising:
    a current mirror comprising a reference current transistor and a mirrored current transistor, wherein
        gate electrodes of the reference and mirrored current transistors are tied and are connected to a drain electrode of the reference current transistor;
    a pull-down network comprising a first and a second pull-down transistor, wherein
        gate electrodes of the first and second pull-down transistors are respectively connected to an input signal node and an inverted input signal node, and
        conduction channels of the first and second pull-down transistors are respectively connected in series with conduction channels of the reference and mirrored current transistors;
    a pull-up transistor having a conduction channel connected to an intermediate node located between the mirrored current transistor and the second pull-down transistor;
    a transition control transistor having a conduction channel connected to the gate electrode of the reference current transistor;
    a first and a second inverter connected in series between the intermediate node and an output signal node, wherein
        a control node is located between the first and second inverters, and
        gate electrodes of the pull-up transistor and the transition control transistor are connected to the control node; and
    a cut-off transistor having a gate electrode connected to the control node and a conduction channel connected in series between the conduction channel of the first pull-down transistor and a common negative power supply voltage for the first and second voltage domains.

2. The level shifter of claim 1, wherein
the input signal comprises a logic high state at a first positive power supply voltage in the first voltage domain,
the output signal comprises a logic high state at a second positive power supply voltage in the second voltage domain, and
the second positive power supply voltage is greater than the first positive power supply voltage.

3. The level shifter of claim 2, wherein
the pull-down network further comprises a third inverter connected in series between the gate electrodes of the first and second pull-down transistors, wherein the third inverter is connected to the first positive power supply voltage and is configured to output either the negative power supply voltage or the first positive power supply voltage.

4. The level shifter of claim 2, wherein
a current conduction path is formed between the second positive power supply voltage and the negative power supply voltage through series-connected conduction channels of the reference current transistor, the first pull-down transistor, and the cut-off transistor.

5. The level shifter of claim 4, wherein
the cut-off transistor is configured to break the current conduction path after the intermediate node has transitioned to a logic high state, and
the transition control transistor is configured to turn off the current mirror after the intermediate node has transitioned to the logic high state.

6. The level shifter of claim 2, wherein
a first charging path is formed through the conduction channel of the mirrored current transistor connected in series between the second positive power supply voltage and the intermediate node,
a second charging path is formed through the conduction channel of the pull-up transistor connected in series between the second positive power supply voltage and the intermediate node, and
the transition control transistor is connected in series between the second positive power supply voltage and the gate electrode of the reference current transistor.

7. The level shifter of claim 6, wherein
after the intermediate node has transitioned to a logic high state:
the control node, the transition control transistor, and the pull-up transistor form a charging control circuit configured to switch the intermediate node from the first charging path to the second charging path to maintain the logic high state at the intermediate node.

8. The level shifter of claim 1, wherein
when a logic high state is present at the input signal node:
the first pull-down transistor is configured to turn on the current mirror,
the mirrored current transistor is configured to charge up the intermediate node,
the first inverter is configured to pull down the control node to a logic low state, which is configured to turn on the transition control transistor and the pull-up transistor,
the transition control transistor is configured to turn off the current mirror as the pull-up transistor is turning on,
the logic low state at the control node is further configured to turn off the cut-off transistor, and
the cut-off transistor is configured to break a current conduction path formed through the reference current transistor, the first pull-down transistor, and the cut-off transistor.

9. The level shifter of claim 1, wherein
when a logic low state is present at the input signal node:
the second pull-down transistor is configured to discharge the intermediate node,
the first inverter is configured to charge up the control node, which is configured to turn off the transition control transistor and the pull-up transistor, and
the control node further turns on the cut-off transistor.

10. The level shifter of claim 1, wherein
the second pull-down transistor is sized to have a pull-down capability stronger than a pull-up capability of the pull-up transistor.

11. The level shifter of claim 1, wherein
the first and second pull-down transistors and the cut-off transistors are n-channel transistors, and
the reference and mirrored current transistors, the transition control transistor, and the pull-up transistor are p-channel transistors.

12. The level shifter of claim 2, further comprising:
a disable circuit comprising:
a first access transistor having a conduction channel coupled between the reference current transistor and the second positive power supply voltage,
a second access transistor having a conduction channel coupled between the mirrored current transistor and the second positive power supply voltage, wherein the first and second access transistors have tied gate electrodes,
a disable inverter having an input connected to an enable signal node and an output connected to a disable signal node, the disable signal node connected to the tied gate electrodes of the first and second access transistors,
a third pull-down transistor having a gate electrode connected to the disable signal node and a conduction channel coupled between the intermediate node and the negative power supply voltage.

13. The level shifter of claim 12, wherein
when a logic low state is present at the enable signal node:
the disable inverter is configured to output a logic high state at the disable signal node, which is configured to turn off the first and second access transistors, and
the logic high state at the disable signal node is further configured to turn on the third pull-down transistor, which is configured to discharge the intermediate node.

14. A level shifter for converting an input signal from a first voltage domain to an output signal for a second voltage domain, the level shifter comprising:
a first and a second n-type transistor, each having a gate electrode respectively connected to an input signal node and an inverted input signal node;
a first and a second p-type transistor, wherein
drain electrodes of the first n-type transistor and the first p-type transistor are tied,
drain electrodes of the second n-type transistor and the second p-type transistor are tied at an intermediate node, and
gate electrodes of the first and second p-type transistors are tied and connected to the drain electrode of the first p-type transistor;
a first and a second inverter connected in series between the intermediate node and an output signal node, wherein a control node is located between the first and second inverters;
a third p-type transistor having a gate electrode connected to the control node and a drain electrode connected to the tied gate electrodes of the first and second p-type transistors;
a fourth p-type transistor having a gate electrode connected to the control node and a drain electrode connected to the intermediate node; and
a third n-type transistor having a gate electrode connected to the control node, a drain electrode connected to a source electrode of the first n-type transistor, and a source electrode connected to a common negative power supply voltage for the first and second voltage domains.

15. The level shifter of claim 14, wherein
the input signal comprises a logic high state at a first positive power supply voltage in the first voltage domain,
the output signal comprises a logic high state at a second positive power supply voltage in the second voltage domain, and
the second positive power supply voltage is greater than the first positive power supply voltage.

16. The level shifter of claim 15, wherein
source electrodes of the first, second, third, and fourth p-type transistors are connected to the second positive power supply voltage.

17. The level shifter of claim 15, wherein
the first and second inverters are powered by the second positive power supply voltage.

18. The level shifter of claim 15, further comprising:
a third inverter connected in series between the gate electrodes of the first and second n-type transistors, the third inverter is powered by the first positive power supply voltage.

19. The level shifter of claim 14, wherein
the third n-type transistor is configured to break a current conduction path formed through series-connected conduction channels of the first p-type transistor, the first n-type transistor, and the third n-type transistor after the intermediate node has transitioned to a logic high state in response to a logic high state at the input signal node, and the third p-type transistor is configured to turn off the first and second p-type transistors after the intermediate node has transitioned to the logic high state.

20. The level shifter of claim 19, wherein after the intermediate node has transitioned to the logic high state:

the control node, the third p-type transistor, and the fourth p-type transistor form a charging control circuit configured to switch from a pull-up current provided by the second p-type transistor to another pull-up current provided by the fourth p-type transistor to maintain the logic high state at the intermediate node.

* * * * *